(12) United States Patent
Lu

(10) Patent No.: US 7,782,243 B1
(45) Date of Patent: Aug. 24, 2010

(54) DIRECT CAPACITANCE-TO-DIGITAL CONVERTER

(75) Inventor: Chih-Shiun Lu, Hsinchu (TW)

(73) Assignee: WindTop Technology Corp., Hsinchu (TW)

( * ) Notice: Subject to any disclaimer, the term of this patent is extended or adjusted under 35 U.S.C. 154(b) by 27 days.

(21) Appl. No.: 12/401,621

(22) Filed: Mar. 11, 2009

(51) Int. Cl.
*H03M 1/12* (2006.01)
(52) U.S. Cl. .................... 341/172; 341/155
(58) Field of Classification Search ............... 341/172, 341/155, 143, 156; 340/870.37; 324/678, 324/60
See application file for complete search history.

(56) References Cited

U.S. PATENT DOCUMENTS 6,509,746 B1 * 1/2003 Wang .................... 324/678

* cited by examiner

*Primary Examiner*—Rexford N Barnie
*Assistant Examiner*—Joseph Lauture

(57) ABSTRACT

A direct capacitance-to-digital converter is provided, including a plurality of switches, an ADC, a reference voltage circuit and a trigger unit. By using trigger unit to control a plurality of switches, and combining the reference voltages outputted by the reference voltage circuit, the converter can directly sense the external to-be-measured capacitor and related stray capacitor, and directly convert the capacitance of the to-be-measured capacitor into accurate digital signal. The present invention can be integrated with other sensors into a single chip to form an integrated direct capacitance-to-digital converter.

4 Claims, 12 Drawing Sheets

DIRECT CAPACITANCE-TO-DIGITAL CONVERTER

FIELD OF THE INVENTION

The present invention generally relates to a direct capacitance-to-digital converter, and more specifically to a converter able to directly sensing the capacitance and converting to precise digital signal without external amplifier.

BACKGROUND OF THE INVENTION

With the rapid progress of digital technology and the development of semiconductor manufacturing process, the electronic industry has developed highly integrated and powerful processor or graphic chips. However, these powerful digital chips can only operate with the digital input signal, while most of the electrical signals are analog. Therefore, many analog-to-digital converters (ADC) have been developed to meet different demands, such as, high speed or high resolution ADC. The analog electrical signal is usually generated by sensors, such as, voltage sensor, luminance sensor, temperature sensor, ultrasonic sensor, speed sensor or humidity sensor. In particular, the rapid development of sensors applied to Microelectro-mechanical System (MEMS) in recent years has gained popularity in many consumer electronic products. For example, Wii from Nintendo uses a MEMS-based three-axial acceleration sensor to work with wireless controller to achieve the highly creative entertainment. In addition, touch panel is another popular application.

These applications use sensors and amplifier to connect to ADC. Among them, Σ-Δ (sigma-delta) ADC is a common choice of ADC.

FIG. 1 shows a schematic view of a functional diagram of the conventional apparatus for converting inductive capacitance. As shown in FIG. 1, an apparatus 1 for converting inductive capacitance includes a sensor 10, a sensor amplifier 20, a bias circuit 30 and ADC 40, where sensor amplifier 20 amplifies the output signal from sensor 10, and ADC 40 converts into digital signals. Bias circuitry 30 provides suitable bias voltage for sensor amplifier 20 and ADC 40.

FIG. 2 shows a detailed view of FIG. 1. As shown in FIG. 2, the electric model of sensor 10 shows a capacitor CS and equivalent input impedance R. Capacitor CS has a capacitance change ACS caused by the external environmental change. Under the condition of bias voltage Vbias, capacitor CS voltage change is ΔVCS, which is amplified by sensor amplifier 20 and input to ADC 40. Take a one-stage Σ-Δ ADC as an example. ADC 40 includes a first-stage converter circuit 41 and a comparator 45, where first-stage converter circuit 41 further includes a subtracter 42, an adder 43, a delay relay 44 and a digital-to-analog converter (DAC) 46. DAC 46 converts the digital output signal Vout from comparator 45 into analog signal. Subtracter 42 finds the difference between the output signal of sensor amplifier 20 and the output signal of DAC 46. Adder 43 adds the output signal of delay relay 44 to the difference, and outputs to delay relay 44 so as to complete the entire ADC operation. As Σ-Δ ADC is a commonly known technique, the above description is only to highlight the key points.

In FIG. 2, stray capacitor C2 is connected to capacitor CS and ground. Stray capacitor is an additional equivalent capacitor generated by errors in manufacturing process or circuit layout, and the capacitance of capacitor C2 will vary with different manufacturing process and circuit.

In addition, in a conventional Σ-Δ ADC structure, to improve the resolution of ADC, a structure with a plurality of serial stages is usually used. That is, the output signal of first-stage converter circuit 41 can be passed to the next stage converter circuit, and the last stage converter circuit is connected to the comparator.

However, the conventional technique has the drawback of requiring a bias circuit able to generate a bias voltage and a first-stage amplifier so as to increase the sensing sensitivity. However, it is a difficult challenge for the general IC fabrication process to overcome the noise in the bias circuit, and also difficult to integrate into the other existing function blocks operating at low voltage.

Another drawback of the conventional technique is requiring a high quality amplifier to amplify the low inductive voltage to the voltage range processable by ADC. As the amplifier requires a large size chip area, the chip cost increases and the offset, gain and noise of the amplifier will also increase the signal error.

Yet another drawback of the convention technique is the accuracy of the overall ADC by the stray capacitor due to manufacturing errors or circuit layout, which also varies with the manufacturing process and circuit, leading to the unstable ADC.

Hence, it is imperative to devise an apparatus able to directly convert the capacitance to digital signal, by using ADC to directly convert the low level output signal to digital signal to save the sensor amplifier and the bias circuit to facilitate a smaller-size chip area, as well as eliminating the unstable problem of ADC caused by stray capacitor and increasing the ADC accuracy.

SUMMARY OF THE INVENTION

The primary object of the present invention is to provide a direct capacitance-to-digital converter, by using a trigger unit to control a plurality of switches, combining with reference voltage outputted by reference voltage circuit to directly measure the to-be-measured capacitance change and directly convert into digital signal so as to improve the accuracy of the digital signal, as well as integrating plural switches, converter, reference voltage circuit, and controller into a single chip to form an integrated single-chip without the extra external high voltage bias circuit and high quality sensor amplifier.

Another object of the present invention is to provide a direct capacitance-to-digital converter, by using a differential ADC having a differential integrator to convert the inductive capacitance of the to-be-measured element into digital signal in a differential manner so as to improve the anti-interference of noise.

Hence, the direct capacitance-to-digital convert of the present invention can solve the drawbacks caused by the stray capacitance of the to-be-measured element.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

Figure 1:
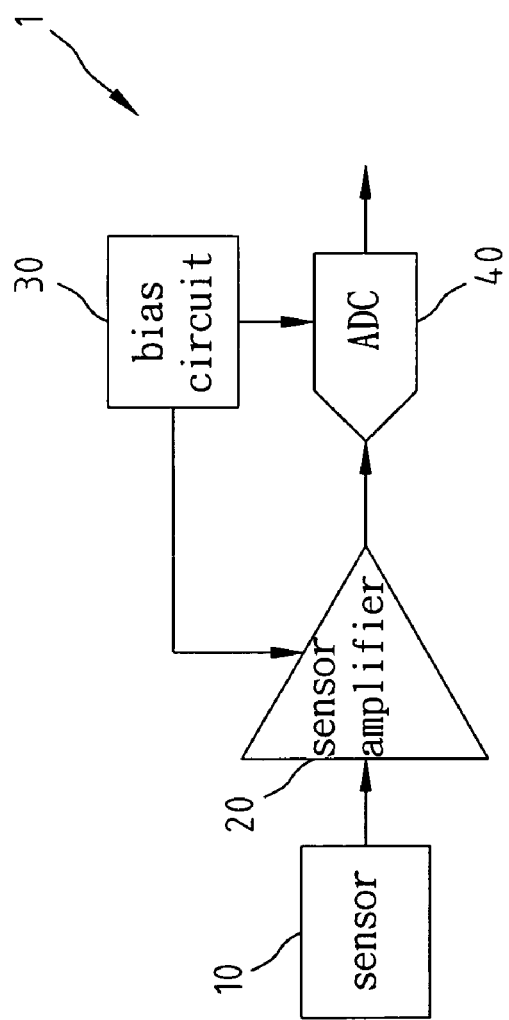
FIG. 1 shows a functional block diagram of a conventional apparatus for converting the inductive capacitance to voltage.
Figure 2:
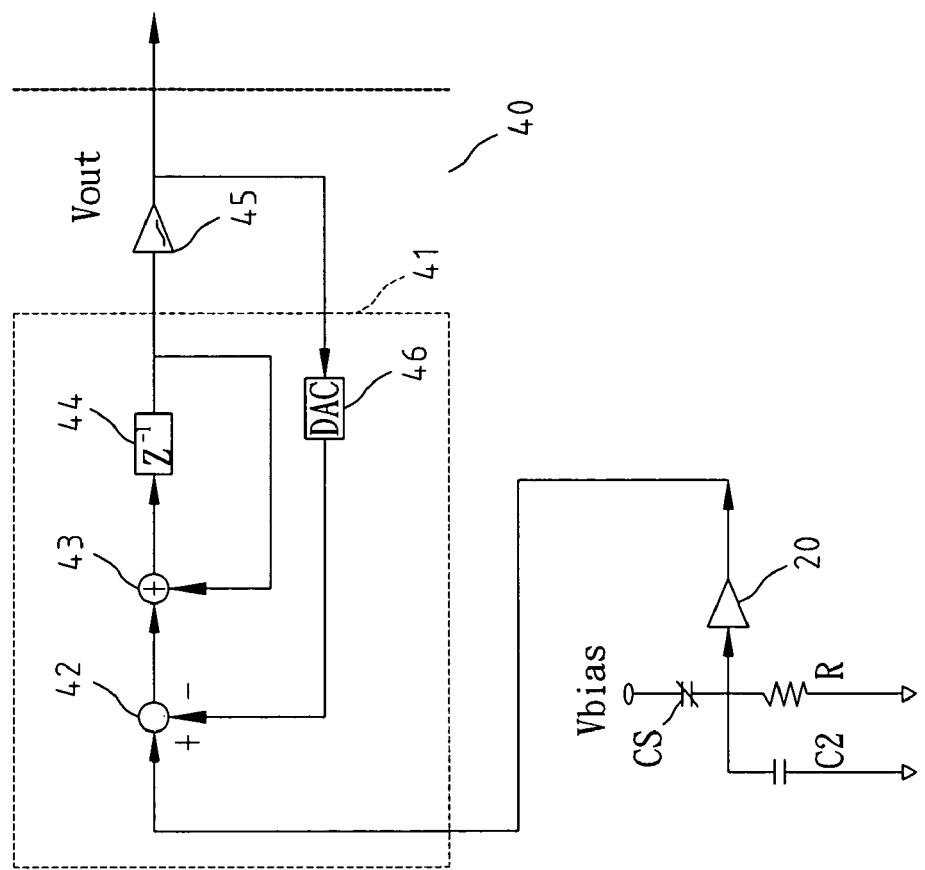
FIG. 2 shows a detailed schematic view of FIG. 1.
Figure 3:
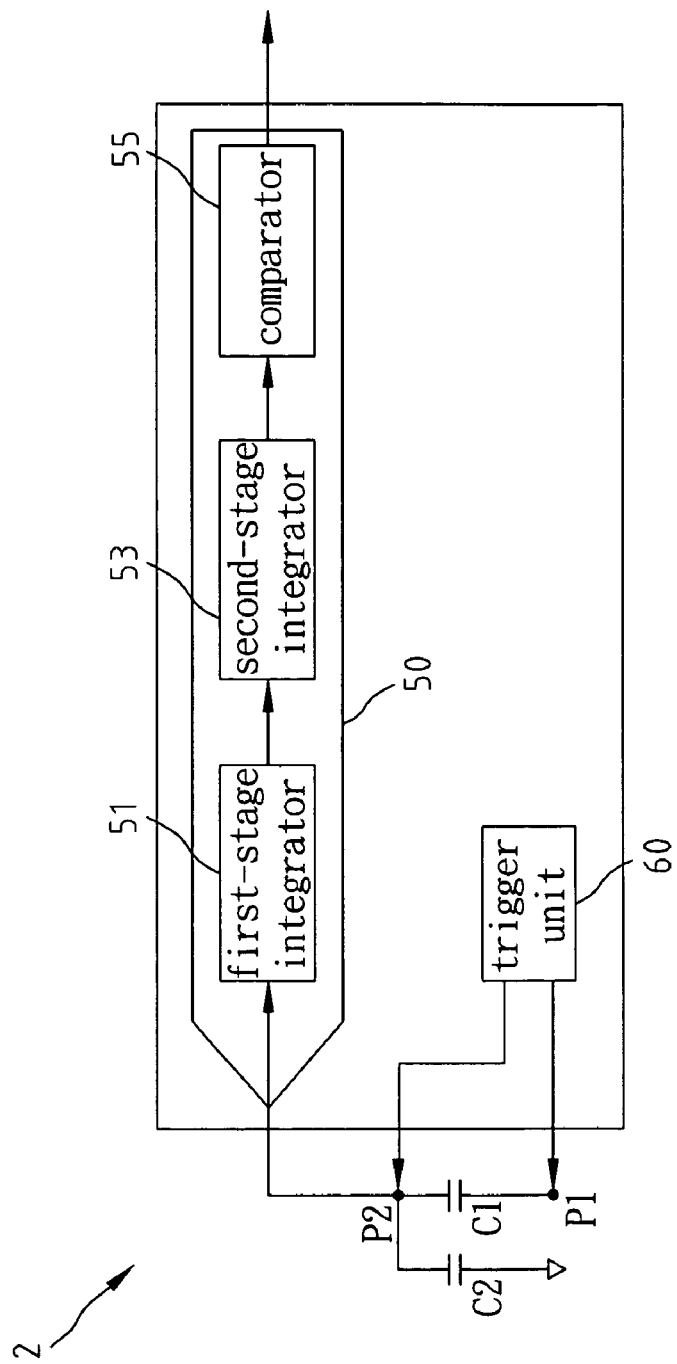
FIG. 3 shows a functional block diagram of an ADC converter according to the present invention.

FIG. 3 shows a schematic view of the functional block diagram of the direct capacitance-to-digital converter of the present invention. As shown in FIG. 3, a direct capacitance-to-digital converter 2 of the present invention includes an ADC 50 and a trigger unit 60, for sensing the capacitance of to-be-measured capacitor C1, and stray capacitor C2 being the stray capacitance generated by the manufacturing process and being related to capacitor C1, where ADC 50 includes a a first-stage integrator 51, a second-stage integrator 53 and a comparator 55. Trigger unit 60 controls a first end P1 and a second end P2 of to capacitor C1, where stray capacitor C2 is connected to second end P2 of to-be-measured capacitor C1, and trigger unit 60 controls first-stage integrator 51 of ADC 50. Second-stage integrator 53 and comparator 55 can be implemented with general integrator and comparator. It is worth noting that second-stage integrator 53 can be plural serially-connected integrators to improve the resolution.

Figure 4:
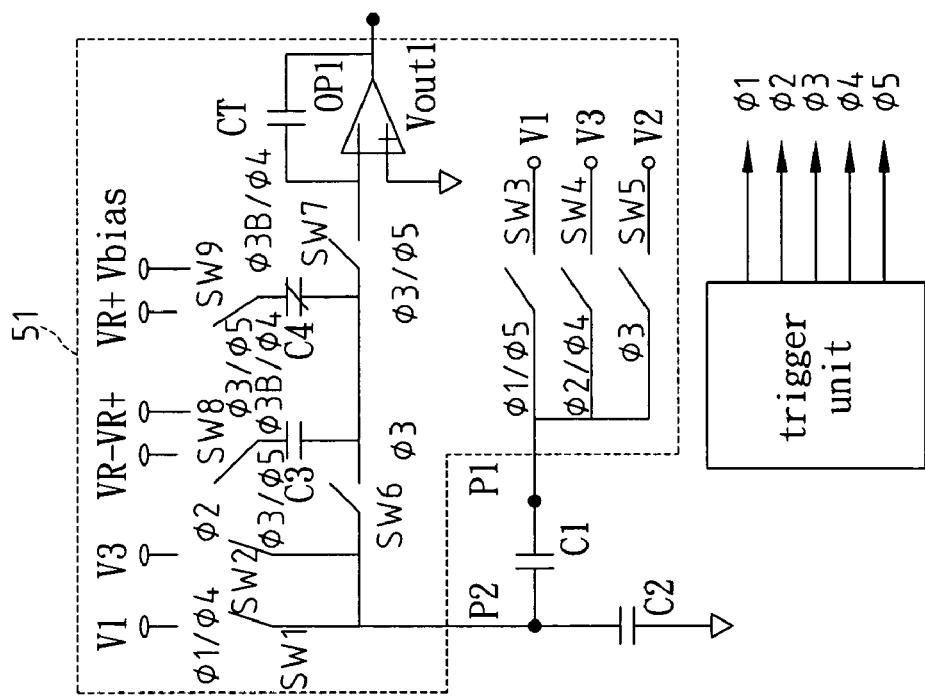
FIG. 4 shows a detailed schematic view of FIG. 3.

FIG. 4 shows a detailed schematic view of FIG. 3. FIG. 4 shows the circuit of first-stage integrator 51. First-stage integrator 51 includes a DAC capacitor C3, an external compensation capacitor C4, an amplifier OP1, an integral capacitor CT, a first switch SW1, a second switch SW2, a third switch SW3, a fourth switch SW4, a fifth switch SW5, a sixth switch SW6, a seventh switch SW7, an eighth SW8 and a ninth switch SW9, where all the switches SW1-SW9 are controlled by a first switch signal ϕ1, a second switch signal ϕ2, a third switch signal ϕ3, a third inverted switch signal ϕ3B, a fourth switch signal ϕ4 and a fifth switch signal ϕ5 generated by trigger unit 60, for performing charging and discharging on capacitor C1, stray capacitor C2, DAC capacitor C3 and external compensation capacitor C4, while using the integrator formed by amplifier OP1 and integral capacitor CT to perform integration to generate a first-stage integrator output voltage Vout1.

Bias voltage Vbias of FIG. 4 is generated by a bias circuit (not shown), and first reference voltage V1, second reference voltage V2, third reference voltage V3, high level reference voltage VR+ and low level reference voltage VR− are generated by reference circuit (not shown), where third reference voltage V3 is higher than second reference voltage V2, second reference voltage V2 is higher than first reference voltage V1, and high level reference voltage VR+ is higher than low level reference voltage VR−.

Bias circuit and reference circuit can be implemented with general technology, such as Wilson current mirror or Widlar current source as the bias circuit, and breakdown diode with temperature compensation circuit or bandgap reference circuit as the reference circuit. It is worth noting that the present invention is not limited to any specific implementation of the bias circuit or the reference circuit. Any implementation able to provide required bias voltage and reference voltage is within the scope of the present invention. In addition, trigger unit 60 is for generating the switch signals. Therefore, trigger unit 60 implemented by, such as, microprocessor with firmware or logic circuit, is also within the scope of the present invention.

DAC capacitor C3 uses high level reference voltage VR+ and low level reference voltage VR− to realize the DAC function. That is, when comparator 55 outputs a bit "1", third switch signal ϕ3 or fifth switch signal ϕ5 generated by trigger unit 60 uses high level reference voltage VR+ to charge DAC capacitor C3. When comparator 55 outputs a bit "0", third inverted switch signal ϕ3B or fourth switch signal ϕ5 generated by trigger unit 60 uses low level reference voltage VR− to charge DAC capacitor C3. That is, the digital bit "1" is converted into analog high level reference voltage VR+ and digital bit "0" is converted into analog low level reference voltage VR−.

External compensation capacitor C4 is to compensate the parasitic capacitance, and can be implemented by using capacitor array and the internal circuit performing self-rectification of a plurality of bits, or using laser trimming or current trimming to perform the fine-tuning of a plurality of bits.

The operation of direct capacitance-to-digital converter 2 of the present invention includes a first operation and a second operation, where the first operation is for sensing the stray capacitance C2 and the second operation is to combine with the result of the first operation to perform conversion of the to-be-measured capacitor C1 so as to generate accurate digital signal. The following describes the first and the second operations.

Figure 5:
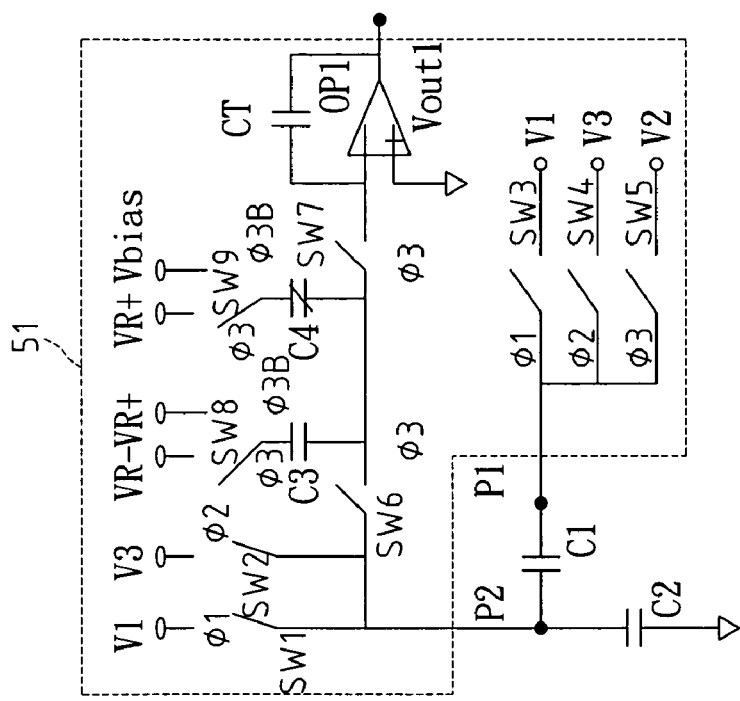
FIG. 5 shows a schematic view of the first operation of the first embodiment of the present invention.
Figure 6:
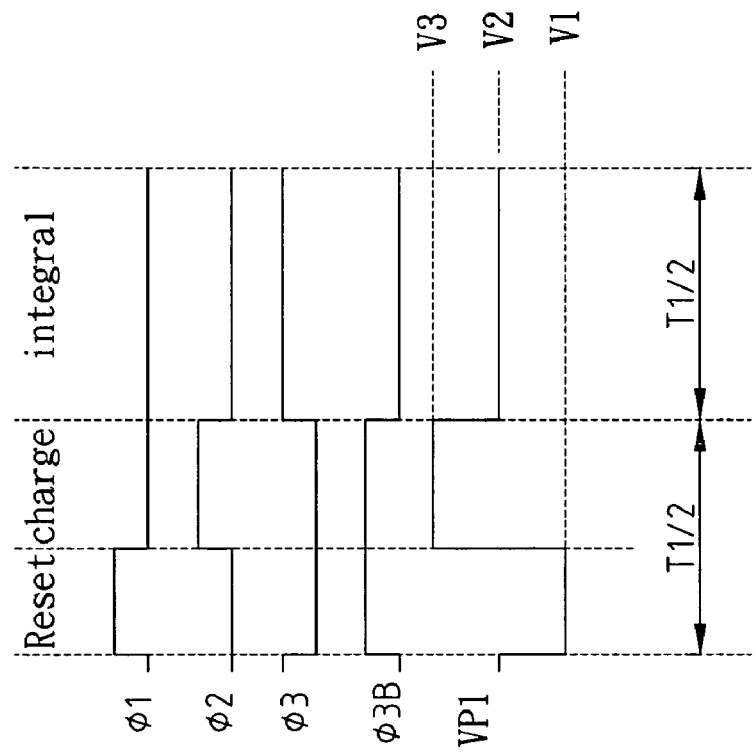
FIG. 6 shows the waveform of FIG. 5.

FIG. 5 shows a schematic view of the first operation of the first embodiment of the present invention. As shown in FIG. 5, first switch signal ϕ1, second switch signal ϕ2, third switch signal ϕ3 and third inverted switch signal ϕ3B generated by trigger unit 60 are used to control switches SW1-SW9. The following description also refers to the waveform of FIG. 6. In FIG. 6, the operation waveforms of first switch signal ϕ1, second switch signal ϕ2, third switch signal ϕ3 and third inverted switch signal ϕ3B are divided into three steps, including reset operation, charge operation and integral operation for setting first end voltage VP1 of first end P1 to first reference voltage V1, third reference voltage V3 or second reference voltage V2.

In the reset operation, first switch signal ϕ1 is at high level, second switch signal ϕ2 and third switch signal ϕ3 are at low level, and third inverted switch signal ϕ3B is at high level. Therefore, first end P1 and second end P2 are connected to first reference voltage V1 to discharge capacitor C1 and the cross-over voltage is 0V, while stray capacitor C2 is also discharged to 0V if select right voltage V1 (note, the symbol "ground" in the schematic is a reference ground, it can be any voltage).

In the charge operation, second switch signal ϕ2 is at high level, first switch signal ϕ1 and third switch signal ϕ3 are at low level, and third inverted switch signal ϕ3B is at high level. Therefore, first end P1 and second end P2 are connected to third reference voltage V3 so that the cross-over voltage of capacitor C1 remains 0V, while stray capacitor C2 is charged from first reference voltage V1 to third reference voltage V3.

In the integral operation, third switch signal φ3 is at high level, first switch signal φ1, second switch signal φ2 and third inverted switch signal φ3B are at low level.

Therefore, first end P1 is connected to second reference voltage V2, and second end P2 is connected to inverted input end of amplifier OP1. The charge transfer to OP1 is C2*(V2−V3). In the mean time, DAC capacitor C3 is switched from high level reference voltage VR+ to low level reference voltage VR−. External compensation capacitor C4 is switched from bias voltage Vbias to high level reference voltage VR+ and the voltage difference is added to the inverted input end of amplifier OP1. Amplifier OP1 and integral capacitor CT perform integral operation on the signal at the inverted input end and generates a first integrator output voltage Vout1 related to stray capacitor C2 at the output end of amplifier OP1.

The total time for the reset operation and the charge operation is T1/2, and the time for integral operation is T1/2, where T1 is the first operation period.

Figure 7:
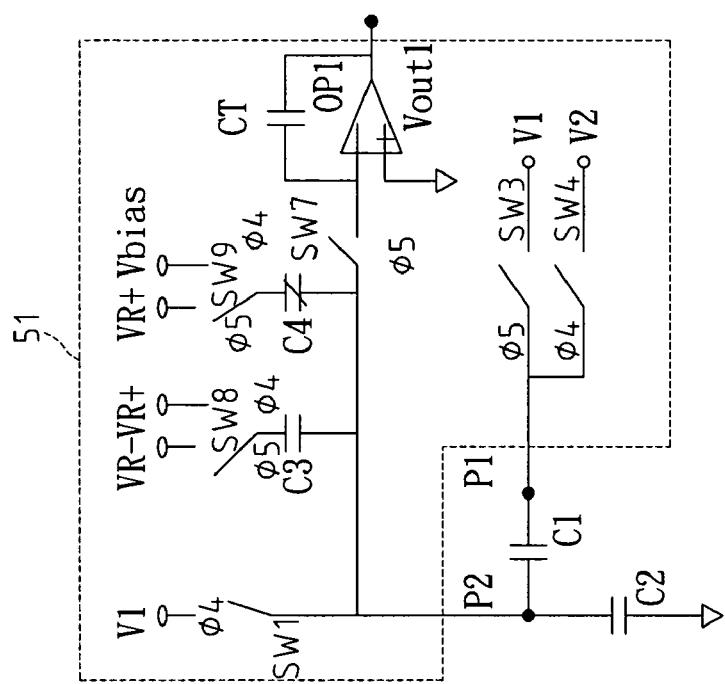
FIG. 7 shows a schematic view of the second operation of the first embodiment of the present invention.
Figure 8:
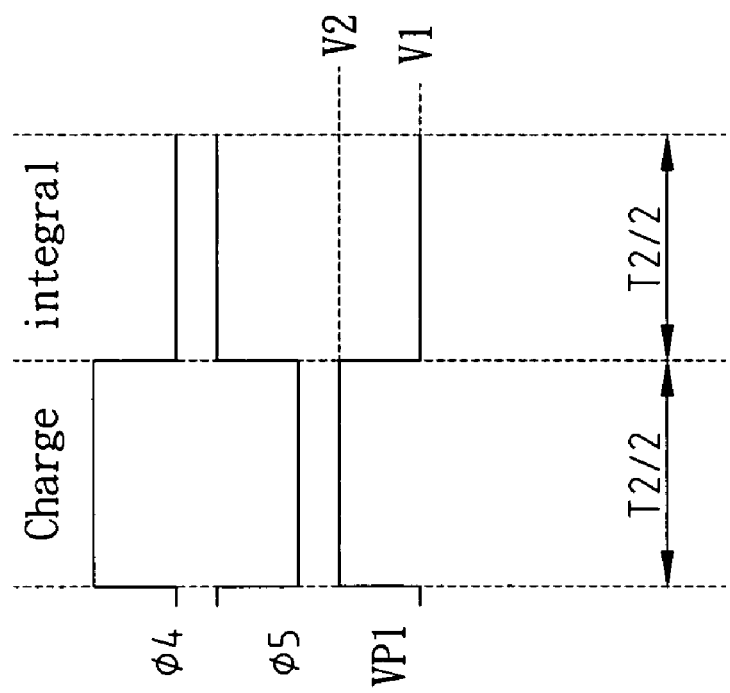
FIG. 8 shows the waveform of FIG. 7.

FIG. 7 shows a schematic view of the second operation of the first embodiment of the present invention. As shown in FIG. 7, fourth switch signal φ4 and fifth switch signal φ5 generated by trigger unit 60 are used to control switches SW1-SW9. The following description also refers to the waveform of FIG. 8. In FIG. 8, the operation waveforms of fourth switch signal φ4 and fifth switch signal φ5 are divided into two steps, including charge operation and integral operation.

In the charge operation, fourth switch signal φ4 is at high level, and fifth switch signal φ5 is at low level. Therefore, first end P1 of capacitor C1 is connected to second reference voltage V2, and second end P2 is connected to first reference voltage V1 so that the cross-over voltage of capacitor C1 is V1−V2. Stray capacitor C2 is charged to first reference voltage V1. (note, the ground symbol in the schematic is stand for reference ground level, it could be any voltage). First end of DAC capacitor C3 and first end of external compensation capacitor C4 are connected to second end P2 of capacitor C1. Second end of DAC capacitor C3 is connected to high level reference voltage VR+, and second end of external compensation capacitor C4 is connected to bias voltage Vbias. The time for charge operation is T2/2, where T2 is the second operation period.

In the integral operation, fifth switch signal φ5 is at high level, and fourth switch signal φ4 is at low level. Therefore, first end P1 of capacitor C1 is connected to first reference voltage V1, and second end P2 is connected to inverted input end of amplifier OP1. In the mean time, DAC capacitor C3 is switched from high level reference voltage VR+ to low level reference voltage VR−. External compensation capacitor C4 is switched from bias voltage Vbias to high level reference voltage VR+ and the voltage difference is added to the inverted input end of amplifier OP1. Amplifier OP1 and integral capacitor CT perform integral operation on the signal at the inverted input end and generates a first integrator output voltage Vout1 related to capacitor C1 at the output end of amplifier OP1. The time for integral operation is T2/2, and therefore the time for charge operation is the same as the time for integral operation.

The accurate digital signals can be obtained through first integrator output voltage Vout1 generated by the aforementioned first and the second operations.

Figure 9:
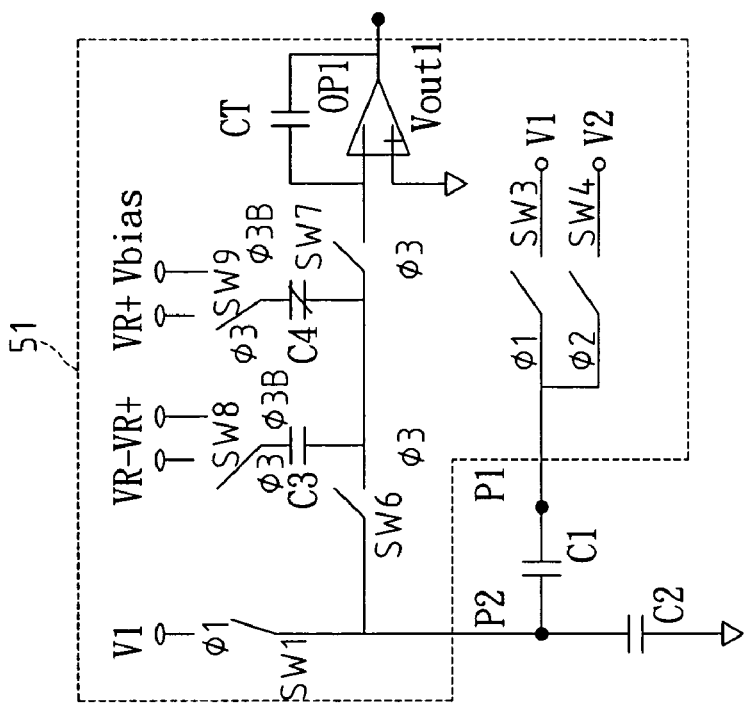
FIG. 9 shows a schematic view of the second embodiment of the first operation of the embodiment.

Refer to FIG. 9. The first operation of the present invention can also have different order and voltage to achieve the identical result.

Figure 10:
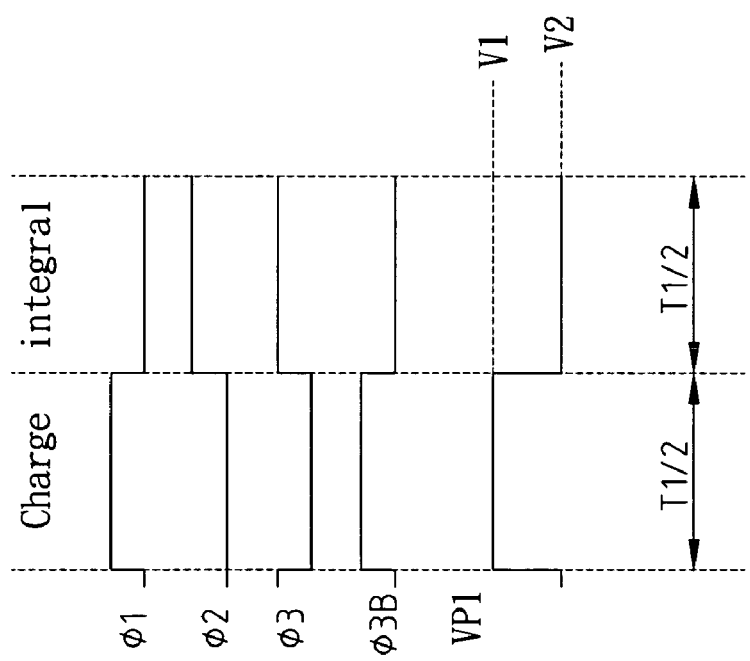
FIG. 10 shows the waveform of FIG. 9.

As shown in FIG. 9, first switch signal φ1, second switch signal φ2, third switch signal φ3 and third inverted switch signal φ3B generated by trigger unit 60 are used to control switches SW1-SW9. The following description also refers to the waveform of FIG. 10. In FIG. 10, the operation waveforms of first switch signal φ1, second switch signal φ2, third switch signal φ3 and third inverted switch signal φ3B are divided into two steps, including charge operation and integral operation.

In the charge operation, first switch signal φ1 is at high level, second switch signal φ2 and third switch signal φ3 are at low level, and third inverted switch signal φ3B is at high level. Therefore, first end P1 and second end P2 are connected to first reference voltage V1 to discharge capacitor C1 and the cross-over voltage is 0V, while stray capacitor C2 is charged to first reference voltage V1.

In the integral operation, second switch signal φ2 and third switch signal φ3 are at high level, while first switch signal φ1 and third inverted switch signal φ3B are at low level. Therefore, first end P1 is connected to second reference voltage V2, and second end P2 is connected to inverted input end of amplifier OP1. In the mean time, DAC capacitor C3 is switched from high level reference voltage VR+ to low level reference voltage VR−. External compensation capacitor C4 is switched from bias voltage Vbias to high level reference voltage VR+ and the voltage difference is added to the inverted input end of amplifier OP1. Amplifier OP1 and integral capacitor CT perform integral operation on the signal at the inverted input end and generates a first integrator output voltage Vout1 related to stray capacitor C2 at the output end of amplifier OP1. Again, the "ground reference" symbol can be any voltage.

The time for the charge operation is T1/2, and the time for integral operation is T1/2, where T1 is the first operation period.

Figure 11:
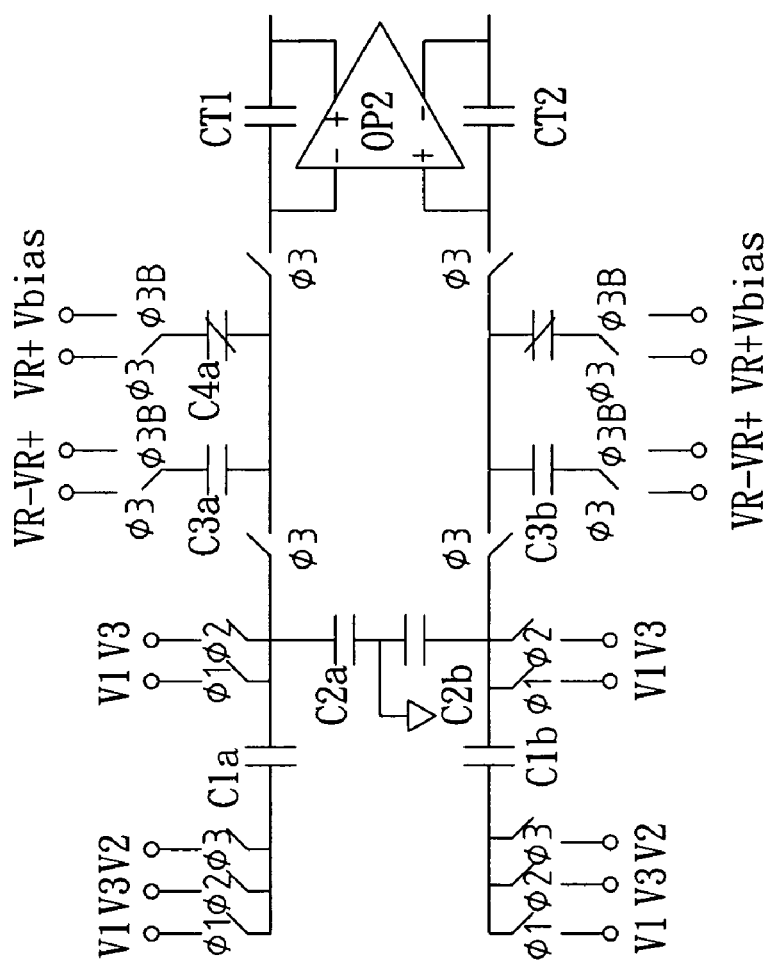
FIG. 11 shows a schematic view of the second embodiment of the present invention.

FIG. 11 shows a schematic view of a second embodiment of the present invention. Compared to the first embodiment in FIG. 4, the second embodiment of the present invention uses differential amplifier to replace the single-ended amplifier of the first embodiment. That is, a differential amplifier OP1D is used to replace amplifier OP1 of FIG. 4. In the mean time, inverted integration capacitor CT1 and non-inverted integration capacitor CT2 are used to replace integration capacitor CT of FIG. 4. In addition, the differential to-be-measure capacitor formed by inverted to-be-measured capacitor C1a and non-inverted to-be-measured capacitor C1b replaces to-be-measured capacitor C1, where the voltages at the two ends of inverted to-be-measured capacitor C1a and non-inverted to-be-measured capacitor C1b are controlled by trigger unit 60. A differential stray capacitor formed by inverted stray capacitor C2a and non-inverted stray capacitor C2b replaces stray capacitor C2, a differential DAC capacitor formed by inverted DAC capacitor C3a and non-inverted DAC capacitor C3b replaces DAC capacitor C3, and a differential external compensation capacitor formed by inverted external compensation capacitor C4a and non-inverted external compensation capacitor C4b replaces external compensation capacitor C4. As the switch signals are the same as in the first embodiment and the overall operation of the circuit is identical, the description is omitted here.

Figure 12:
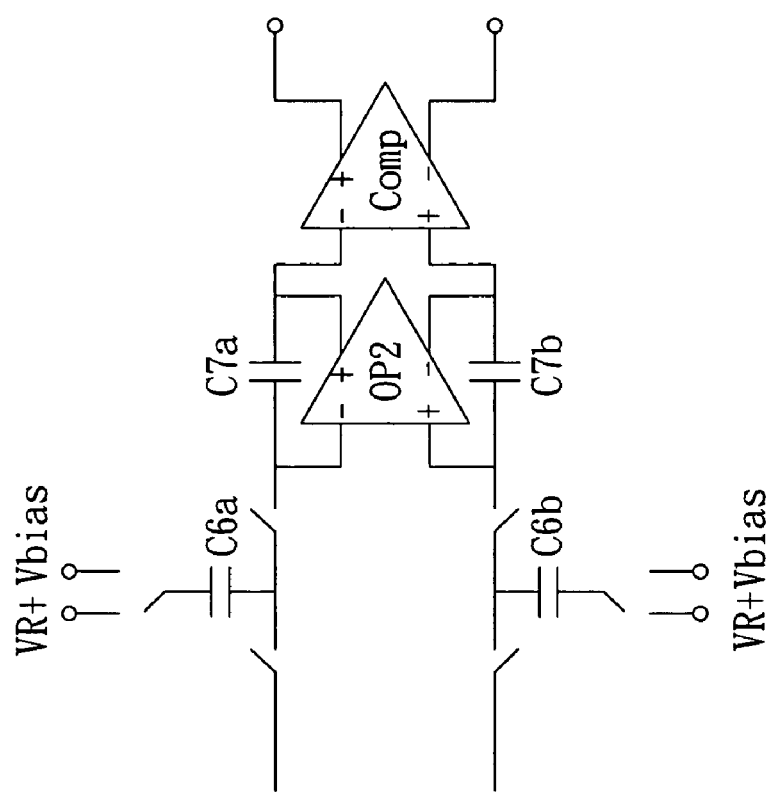
FIG. 12 shows a schematic view of the second-stage integrator and the comparator of the second embodiment of the present invention.

FIG. 12 shows a schematic view of the second-stage integrator and the comparator of the second embodiment of the present invention. As shown in FIG. 10, the second-stage integrator of the second embodiment includes a differential amplifier OP2D, an inverted integration capacitor C7a, and non-inverted integration capacitor C7b. Comparator Comp is a differential comparator. Inverted DAC capacitor C6a and non-inverted DAC capacitor C6b are to realize the function of DAC, as DAC capacitor C3 of the first embodiment. Hence, combining the first-stage integrator of FIG. 9 and the second-stage integrator and comparator of FIG. 10, the formed differential ADC has a better anti-noise capability and is applicable to the electrical environment difficult to rid of noise.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A direct capacitance-to-digital converter, for sensing a stray capacitor related to a to-be-measured capacitor, and directly converting an inductive capacitance of said to-be-measured capacitor into a digital signal, a first end of said stray capacitor being connected to a first end of said to-be-measured capacitor, a second end of said stray capacitor being grounded, said direct capacitance-to-digital converter comprising:

a first integrator, for receiving an input signal at second end of said to-be-measured capacitor, after integration, generating a first-stage integrator output signal;

a second-stage integrator, for receiving said first-stage integrator output signal, after integration, generating a second-stage integrator output signal, said second-stage integrator further comprising an integral capacitor and an integral amplifier, one end of said integral capacitor and an inverted input end of said integral amplifier being connected to input signal of said second-stage integrator, a non-inverted input end of said integral amplifier being grounded, the other end of said integral capacitor and an output end of said integral amplifier being connected to said second-stage integrator output signal;

a comparator, for receiving said second-stage integrator output signal, after comparing with a standard voltage, generating said digital signal; and a trigger unit, for generating a plurality of control signals to control first end and second end of said to-be-measured capacitor and said first-stage integrator, said control signals comprising a first switch signal, a second switch signal, a third switch signal, a third inverted switch signal, a fourth switch signal and a fifth switch, said third inverted switch signal being the inverted phase of said third switch signal, high level of said first switch signal not overlapping high level of said fifth switch signal;

where said trigger unit sequentially generating high level of said first switch signal, said second switch signal and said third switch signal for sensing voltage of said stray capacitor, and said trigger unit sequentially generating high level of said fourth switch signal and said fifth switch signal for sensing voltage of said to-be-measured capacitor.

2. The converter as claimed in claim 1, wherein said first-stage integrator further comprises:

a plurality of switches, controlled by said control signals of said trigger unit, said switches comprising a first switch, a second switch, a third switch, a fourth switch, a fifth switch, a sixth switch, a seventh switch, an eighth switch and a ninth switch, said first end of said to-be-measured capacitor being connected to said third switch, said fourth switch and said fifth switch, said second end of to-be-measured capacitor being connected to said first switch, said second switch and said sixth switch;

a DAC capacitor, having a first end and a second end;

an external compensation capacitor, having a first end connected to said ninth switch and a second end connected to said sixth switch, said seventh switch and said second end of said DAC capacitor;

an integral amplifier, having an inverted input end, a non-inverted input end and an output end, said non-inverted input end being grounded, said output end having said first-stage integrator output signal;

an integral capacitor, having a first end connected to said inverted input end of said integral amplifier and a second end connected to said output end of said integral amplifier;

a bias circuit, for generating a bias voltage; and a reference voltage circuit, for generating a first reference voltage, a second reference voltage, a third reference voltage, a high level reference voltage and a low level reference voltage, said third reference voltage being higher than said second reference voltage, said second reference voltage being higher than said first reference voltage, and said high level reference voltage being higher than said low level reference voltage;

where said first switch being controlled by said first switch signal and said fourth switch signal to determine whether to connect said second end of said to-be-measured capacitor and said first reference voltage, said second switch being controlled by said second switch signal to determine whether to connect said second end of said to-be-measured capacitor and said second reference voltage, said third switch being controlled by said first switch signal and said fifth switch signal to determine whether to connect said first end of said to-be-measured capacitor and said first reference voltage, said fourth switch being controlled by said second switch signal and said fourth switch signal to determine whether to connect said first end of said to-be-measured capacitor and said second reference voltage, said fifth switch being controlled by said third switch signal to determine whether to connect said first end of said to-be-measured capacitor and said third reference voltage, said sixth switch being controlled by said third switch signal to determine whether to connect said second end of said to-be-measured capacitor and said second end of said DAC capacitor, said seventh switch being controlled by said third switch signal and said fifth switch signal to determine whether to connect said second end of said DAC capacitor and said inverted input end of said integral amplifier, said eighth switch being controlled by said third switch signal and said fifth switch signal to determine whether to connect said second end of said DAC capacitor to said low level reference voltage and being controlled by said third inverted switch signal and said fourth switch signal to determine whether to connect said second end of said DAC capacitor to said high level reference voltage, and said ninth switch being controlled by said third switch signal and said fifth switch signal to determine whether to connect said first end of said external compensation capacitor to said high level reference voltage and being controlled by said third inverted switch signal and said fourth switch signal to determine whether to connect said first end of said external compensation capacitor to said bias voltage.

3. A direct capacitance-to-digital converter, for sensing an inverted stray capacitor and a non-inverted stray capacitor related to an inverted to-be-measured capacitor and a non-inverted to-be-measured capacitor, and directly converting an inductive capacitance of said to-be-measured capacitor into a digital signal, a first end of said inverted stray capacitor and a first end of said non-inverted stray capacitor being grounded, a second end of said inverted stray capacitor being connected to a second end of said inverted to-be-measured capacitor, a second end of said non-inverted stray capacitor being connected to a second end of said non-inverted to-be-measured capacitor, said direct capacitance-to-digital converter comprising:

- a first integrator, for receiving an inverted input signal of said inverted to-be-measured capacitor and a non-inverted input signal of said non-inverted to-be-measured capacitor, after integration, generating an inverted first-stage integrator output signal and a non-inverted first-stage integrator output signal;
- a second-stage integrator, for receiving said inverted first-stage integrator output signal and said non-inverted first-stage integrator output signal, after integration, generating an inverted second-stage integrator output signal and a non-inverted second-stage integrator output signal, said second-stage integrator further comprising an inverted integral capacitor, a non-inverted integral capacitor and an integral amplifier, one end of said inverted integral capacitor and an inverted input end of said integral amplifier being connected to inverted first-stage integrator output signal of said second-stage integrator, the other end of said inverted integral capacitor and an inverted output end of said integral amplifier being connected to said inverted second-stage integrator output signal, one end of said non-inverted integral capacitor and a non-inverted input end of said integral amplifier being connected to said inverted first-stage integrator output signal of said second-stage integrator, the other end of said non-inverted integral capacitor and a non-inverted output end of said integral amplifier being connected to said second-stage integrator output signal;
- a comparator, for receiving said inverted second-stage integrator output signal and said non-inverted second-stage integral output signal, after comparing with a standard voltage, generating said digital signal; and
- a trigger unit, for generating a plurality of control signals to control first end and second end of said inverted to-be-measured capacitor, first end and second end of said non-inverted to-be-measured capacitor and said first-stage integrator, said control signals comprising a first switch signal, a second switch signal, a third switch signal, a third inverted switch signal, a fourth switch signal and a fifth switch, said third inverted switch signal being the inverted phase of said third switch signal, high level of said first switch signal not overlapping high level of said fifth switch signal;
- where said trigger unit sequentially generating high level of said first switch signal, said second switch signal and said third switch signal for sensing voltages of said inverted stray capacitor and said non-inverted stray capacitor, and said trigger unit sequentially generating high level of said fourth switch signal and said fifth switch signal for sensing voltages of said inverted to-be-measured capacitor and said non-inverted to-be-measured capacitor.

4. The converter as claimed in claim 3, wherein said first-stage integrator further comprises:

- a plurality of switches, controlled by said control signals of said trigger unit, said switches comprising an inverted first switch, an inverted second switch, an inverted third switch, an inverted fourth switch, an inverted fifth switch, an inverted sixth switch, an inverted seventh switch, an inverted eighth switch, an inverted ninth switch, a non-inverted first switch, a non-inverted second switch, a non-inverted third switch, a non-inverted fourth switch, a non-inverted fifth switch, a non-inverted sixth switch, a non-inverted seventh switch, a non-inverted eighth switch and a non-inverted ninth switch, said first end of said inverted to-be-measured capacitor being connected to said inverted third switch, said inverted fourth switch and said inverted fifth switch, said second end of said inverted to-be-measured capacitor being connected to said inverted first switch, said inverted second switch and said inverted sixth switch, said first end of said non-inverted to-be-measured capacitor being connected to said non-inverted third switch, said non-inverted fourth switch and said non-inverted fifth switch, said second end of said non-inverted to-be-measured capacitor being connected to said non-inverted first switch, said non-inverted second switch and said non-inverted sixth switch;
- an inverted DAC capacitor, having a first end and a second end;
- a non-inverted DAC capacitor, having a first end and a second end;
- an inverted external compensation capacitor, having a first end connected to said inverted ninth switch and a second end connected to said inverted sixth switch, said inverted seventh switch and said second end of said inverted DAC capacitor;
- a non-inverted external compensation capacitor, having a first end connected to said non-inverted ninth switch and a second end connected to said non-inverted sixth switch, said non-inverted seventh switch and said second end of said non-inverted DAC capacitor;
- an integral amplifier, having an inverted input end, a non-inverted input end, an inverted output end and a non-inverted output end, said inverted output end having said inverted first-stage integrator output signal and said non-inverted output end having said non-inverted first-stage integrator output signal;
- an inverted integral capacitor, having a first end connected to said inverted input end of said integral amplifier and a second end connected to said inverted output end of said integral amplifier;
- a non-inverted integral capacitor, having a first end connected to said non-inverted input end of said integral amplifier and a second end connected to said non-inverted output end of said integral amplifier;
- a bias circuit, for generating a bias voltage; and
- a reference voltage circuit, for generating a first reference voltage, a second reference voltage, a third reference voltage, a high level reference voltage and a low level reference voltage, said third reference voltage being higher than said second reference voltage, said second reference voltage being higher than said first reference voltage, and said high level reference voltage being higher than said low level reference voltage;
- where said inverted first switch being controlled by said first switch signal and said fourth switch signal to determine whether to connect said second end of said inverted to-be-measured capacitor and said first reference voltage, said inverted second switch being controlled by said second switch signal to determine whether to connect said second end of said inverted to-be-measured capacitor and said second reference voltage, said inverted third switch being controlled by said first switch signal and said fifth switch signal to determine whether to connect said first end of said inverted to-be-measured capacitor and said first reference voltage, said inverted fourth switch being controlled by said second switch signal and said fourth switch signal to determine whether to connect said first end of said inverted to-be-measured capacitor and said second reference voltage, said inverted fifth switch being controlled by said third switch signal to determine whether to connect said first end of said inverted to-be-measured capacitor and said third reference voltage, said inverted sixth switch being controlled by said third switch signal to determine whether to connect said second end of said inverted to-be-measured capacitor and said second end of said inverted DAC capacitor, said inverted seventh switch being controlled by said third switch signal and said fifth switch signal to determine whether to connect said second end of said inverted DAC capacitor and said inverted input end of said integral amplifier, said inverted eighth switch being controlled by said third switch signal and said fifth switch signal to determine whether to connect said second end of said inverted DAC capacitor to said low level reference voltage and being controlled by said third inverted switch signal and said fourth switch signal to determine whether to connect second end of said inverted DAC capacitor to said high level reference voltage, and said inverted ninth switch being controlled by said third switch signal and said fifth switch signal to determine whether to connect said first end of said inverted external compensation capacitor to said high level reference voltage and being controlled by said third inverted switch signal and said fourth switch signal to determine whether to connect said first end of said inverted external compensation capacitor to said bias voltage, and said non-inverted first switch being controlled by said first switch signal and said fourth switch signal to determine whether to connect said second end of said non-inverted to-be-measured capacitor and said first reference voltage, said non-inverted second switch being controlled by said second switch signal to determine whether to connect said second end of said non-inverted to-be-measured capacitor and said second reference voltage, said non-inverted third switch being controlled by said first switch signal and said fifth switch signal to determine whether to connect said first end of said non-inverted to-be-measured capacitor and said first reference voltage, said non-inverted fourth switch being controlled by said second switch signal and said fourth switch signal to determine whether to connect said first end of said non-inverted to-be-measured capacitor and said second reference voltage, said non-inverted fifth switch being controlled by said third switch signal to determine whether to connect said first end of said non-inverted to-be-measured capacitor and said third reference voltage, said non-inverted sixth switch being controlled by said third switch signal to determine whether to connect said second end of said non-inverted to-be-measured capacitor and said second end of said non-inverted DAC capacitor, said non-inverted seventh switch being controlled by said third switch signal and said fifth switch signal to determine whether to connect said second end of said non-inverted DAC capacitor and said non-inverted input end of said integral amplifier, said non-inverted eighth switch being controlled by said third switch signal and said fifth switch signal to determine whether to connect said second end of said non-inverted DAC capacitor to said low level reference voltage and being controlled by said third inverted switch signal and said fourth switch signal to determine whether to connect said second end of said non-inverted DAC capacitor to said high level reference voltage, and said non-inverted ninth switch being controlled by said third switch signal and said fifth switch signal to determine whether to connect said first end of said non-inverted external compensation capacitor to said high level reference voltage and being controlled by said third inverted switch signal and said fourth switch signal to determine whether to connect said first end of said non-inverted external compensation capacitor to said bias voltage.

\* \* \* \* \*